United States Patent [19]

Ohba

[11] Patent Number: 4,471,239
[45] Date of Patent: Sep. 11, 1984

[54] TTL FUNDAMENTAL LOGIC CIRCUIT
[75] Inventor: Osam Ohba, Inagi, Japan
[73] Assignee: Fujitsu Limited, Kawasaki, Japan
[21] Appl. No.: 388,942
[22] Filed: Jun. 16, 1982
[30] Foreign Application Priority Data
  Jun. 26, 1981 [JP] Japan ................................. 56-98379
[51] Int. Cl.³ ................. H03K 19/088; H03K 19/013
[52] U.S. Cl. .................................. 307/456; 307/303; 307/443; 307/567
[58] Field of Search .............. 307/454, 456, 466, 475, 307/299 A, 303, 313, 457, 458, 280, 300, 549, 567, 270, 317 A

[56] References Cited
U.S. PATENT DOCUMENTS

3,631,309 12/1971 Myers .............................. 307/279 X
3,676,713 7/1972 Wiedmann ......................... 307/456
3,699,362 10/1972 Jordan ............................. 307/456 X
3,769,530 10/1973 Kalb et al. ....................... 307/313 X
4,001,868 1/1977 Liang ............................ 307/270 X
4,194,132 3/1980 Mrazek ....................... 307/299 A X

Primary Examiner—Larry N. Anagnos
Assistant Examiner—David R. Bertelson
Attorney, Agent, or Firm—Staas & Halsey

[57] ABSTRACT

A TTL fundamental logic circuit comprising an npn-type input transistor, an npn-type output transistor, and a pnp-type output transistor. The pnp-type output transistor has an emitter connected to the collector of the npn-type output transistor, a base connected to the base of the npn-type output transistor and a collector that is grounded. The pnp-type output transistor is turned on when the npn-type output transistor is turned off, thereby the potential of the high level output signal is decreased, and the propagation delay of the fundamental logic circuit is reduced.

5 Claims, 8 Drawing Figures

TTL FUNDAMENTAL LOGIC CIRCUIT

BACKGROUND OF THE INVENTION (1) Field of the Invention

The present invention relates to a transistor transistor logic (TTL) fundamental logic circuit and more particularly to a TTL logic circuit which is used in a large scale integrated circuit and whose signal amplitude is made small by adding a pnp transistor to an output npn transistor thereof.

(2) Description of the Prior Art

In general, known inverter circuits comprise a combination of an input npn transistor and an output npn transistor, and are used as a fundamental TTL gate circuit in a large scale integrated circuit (hereinafter referred to as an LSI). The signal amplitude, i.e., the potential difference between a high level logic signal and a low level logic signal of this inverter circuit, is very large as will be explained later, so that the propagation delay is large.

There is another known fundamental logic circuit comprising a clamp circuit which is connected in parallel to an output npn transistor and consists of a diode and a resistor connected in series. In this fundamental logic circuit, the signal amplitude can be very small and the propagation delay can be reduced. Such a prior art fundamental logic circuit is disclosed in, for example, U.S. Pat. No. 3,629,609.

However, since the clamp circuit is added to each fundamental logic circuit, the degree of integration of the LSI including such fundamental logic circuits is greatly reduced. Moreover, in such fundamental logic circuits, the potential level of the high level output signal becomes too low due to the insertion of the clamp circuit, and the noise immunity of the logic circuit deteriorates.

SUMMARY OF THE INVENTION

An object of the present invention is to decrease the signal amplitude of a fundamental logic circuit in order to reduce the propagation delay thereof.

Another object of the present invention is to decrease the signal amplitude of a fundamental logic circuit without reducing the degree of integration of an integrating circuit including the fundamental logic circuit.

Still another object of the present invention is to decrease the signal amplitude of a fundamental logic circuit without deteriorating the noise immunity thereof.

According to the present invention, there is provided a TTL fundamental logic circuit having an npn-type input transistor whose emitter is connected to an input terminal and an npn-type output transistor. The npn type output transistor has a base connected to the collector of the npn-type input transistor, a collector connected to an output terminal and to a power supply through a load circuit and an emitter connected to ground. The TTL fundamental logic circuit further comprises a pnp-type output transistor having an emitter connected to the collector of the npn-type output transistor, a base connected to the base of the npn-type output transistor and a collector connected to ground.

DESCRIPTION OF THE PREFERRED EMBODIMENT

With reference to the attached drawings, an embodiment of the present invention will be explained by comparing it with conventional circuits.

Figure 1:
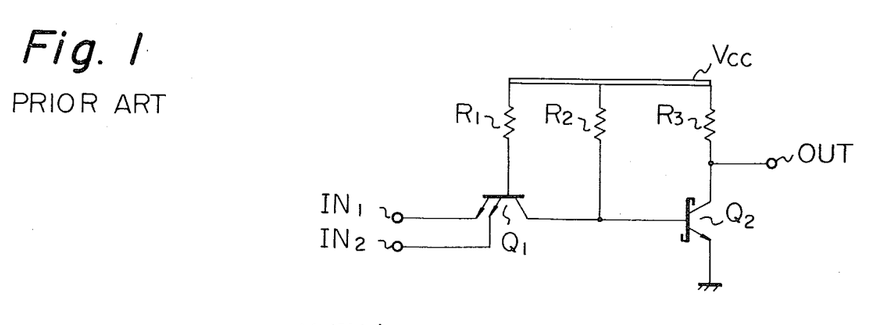
FIG. 1 is a circuit diagram of a conventional TTL fundamental logic circuit.

FIG. 1 is a circuit diagram of a conventional TTL fundamental logic circuit. The logic circuit of FIG. 1 comprises an input npn-type multi-emitter transistor Q1 and an output npn-type transistor Q2 having a Schottky barrier diode as represented in FIG. 1 by a special symbol. In the transistor Q2, the Schottky diode is, as is well known, connected between the base and the collector electrodes in order to increase the switching speed thereof. Two emitter electrodes of the transistor Q1 are respectively connected to the input terminals IN1 and IN2. The base and the collector of the transistor Q1 are connected to a power supply voltage $V_{CC}$ through the first resistor R1 and the second resistor R2, respectively. The base of the transistor Q2 is connected to the collector of the transistor Q1, and the collector of the transistor Q2 is connected to the power supply voltage $V_{CC}$ through the third resistor R2 and to an output terminal OUT. The emitter of the transistor Q2 is grounded.

Figure 2:
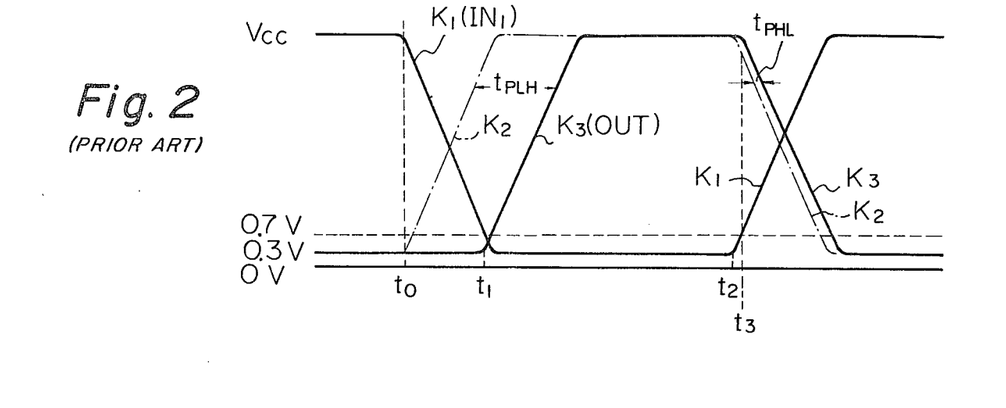
FIG. 2 is a waveform diagram for the operation of the circuit of FIG. 1.

The signal amplitude of the TLL logic circuit of FIG. 1 is very large, as is explained below. FIG. 2 is a waveform diagram of the signals of the nodes of the circuit of FIG. 1. In FIG. 2, the curve K1 shows the signal at the input terminal IN1, the curve K2 of the chain line shows the ideal signal at the output terminal OUT, and the curve K3 shows the actual signal at the output terminal OUT. Assuming that the potential of the input signal IN1 is high, i.e., nearly equal to the power supply voltage $V_{CC}$, the transistor Q1 is in a turned off state and the transistor Q2 is in a turned on condition because a current flows from the power supply through the resistor R2 to the base of the transistor Q2. Therefore, the potential of the output signal at the output terminal OUT is low, i.e., it is nearly equal to 0.3 volts. When the potential of the input terminal IN1 starts to fall at the time $t_0$, as shown by the curve K1, it is ideal for the potential of the output terminal OUT to rise at the same time $t_0$, as shown by the curve K2 of the chain line. However, in practice, the transistor Q2 does not turn off until the potential of the input terminal IN1 falls to the threshold potential, at which time the transistor Q1 is turned on. The threshold potential at which the transistor Q1 is turned on is equal to $V_{BE}(Q2)+V_{BC}(Q1)-V_{BE}(Q1)$. Since $V_{BE}(Q2)$ and $V_{BE}(Q1)$ are nearly equal to each other, the threshold potential is nearly equal to $V_{BC}(Q1)$. In this case, $V_{BE}(Q2)$ is the base-emitter voltage of the transistor Q2, $V_{BC}$(Q1) is the base-collector voltage of the transistor Q1, and $V_{BE}$ (Q1) is the base-emitter voltage of the transistor Q1. Since $V_{BE}$ (Q1) is approximately 0.7 V, the potential of the output terminal OUT shown by the curve K3 starts to rise at time $t_1$ when the potential of the input terminal IN1 shown by the curve K1 falls approximately from 5 V to 0.7 V. Therefore, at the falling edge of the input signal, the time difference between the ideal curve K2 and the curve K3, i.e., the propagation delay $t_{PLH}$, becomes very large. When the potential of the input terminal IN1 rises at time $t_2$ and reaches the threshold potential turning off the transistor Q1 at time $t_3$, the potential of the output terminal OUT starts to fall. The propagation delay $t_{PHL}$ at the falling edge of the input signal is smaller than the aforementioned propagation delay $t_{PLH}$. However, since the output signal of the output terminal OUT is supplied to a TTL fundamental logic circuit of the next stage, which has the same circuit structure as that shown in FIG. 1, as an input signal thereto, the propagation delay $t_{PLH}$ of the next stage is large. Therefore, the total propagation delay of an integrated circuit including the above-mentioned TTL fundamental logic circuit becomes very large. In other words, since the potential of the high level signal of the logic circuit of FIG. 1 is approximately equal to $V_{CC}$, i.e., 5 V, the signal amplitude thereof becomes too large, and the propagation delay is very large.

Figure 3:
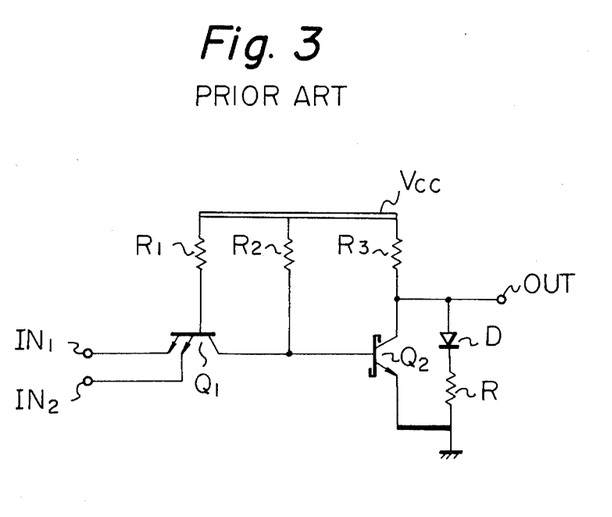
FIG. 3 is a circuit diagram of another conventional TTL fundamental logic circuit comprising a clamp circuit for the decreasing the signal amplitude.

FIG. 3 is a circuit diagram of another conventional TTL fundamental logic circuit whose signal amplitude is small. The circuit of FIG. 3 differs from that of FIG. 1 in that it comprises a clamp circuit which is connected between the collector and the emitter of the output transistor Q2 and in which a diode D and a resistor R are connected in series. In the circuit of FIG. 3, when the potential of the output terminal OUT is high, a current flows from the power supply through the resistor R3, the diode D, and the resistor R to ground. Therefore, the maximum potential of the output terminal OUT becomes approximately 0.9 through 1.0 V, and the propagation delay is greatly reduced.

However, since the fundamental logic circuit of FIG. 3 comprises a clamp circuit consisting of a diode and a resistor, the area occupied by each of the fundamental logic circuits in an integrated circuit device becomes large, so that the degree of integration of the integrated circuit device decreases. Moreover, since the potential of the high level signal at the output terminal OUT is approximately 0.9 through 1.0 V, the potential difference between the high level signal and the threshold potential of 0.7 V is too small and the noise immunity of the logic circuit becomes very small. Therefore, the fundamental logic circuit of FIG. 3 often operates erroneously. The objects of the present invention are to solve these problems of the conventional fundamental logic circuits. An embodiment of the present invention will be explained with reference to the attached drawings.

Figure 4:
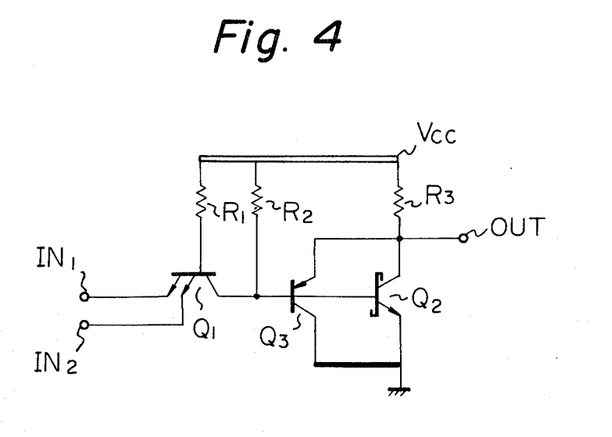
FIG. 4 is a circuit diagram of a TTL fundamental logic circuit according to the present invention.

FIG. 4 is a circuit diagram of a complementary coupled TTL fundamental logic circuit as an embodiment of the present invention. The logic circuit of FIG. 4 is the same as that of FIG. 1 except that the logic circuit of FIG. 4 comprises an additional pnp transistor Q3. The base of the pnp transistor Q3 is connected to the base of the output npn transistor Q2 and to the collector of the input npn transistor Q1. The emitter of the pnp transistor Q3 is connected to the collector of the output npn transistor Q2 and the collector of the pnp transistor Q3 is grounded.

Figure 5:
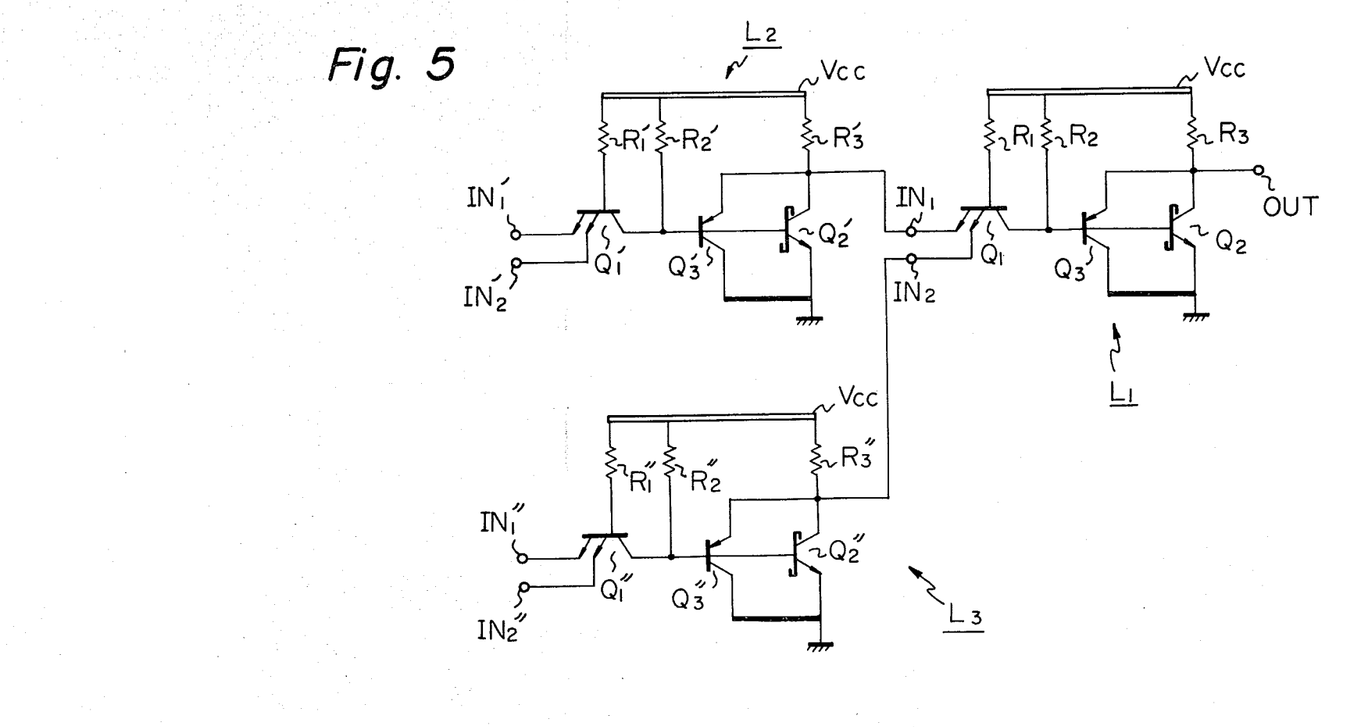
FIG. 5 is a circuit diagram of a circuit formed by combining a plurality of TTL fundamental logic circuits of FIG. 4.

FIG. 5 is a circuit diagram of two pre-stage fundamental logic circuits L2 and L3 connected to the input terminals IN1 and IN2 of the fundamental logic circuit L1, respectively. Each of the logic circuits L1, L2 and L3 has the same circuit structure as that of the logic circuit FIG. 4.

Operation of the fundamental logic circuit according to the present invention will be explained with reference to FIG. 5. Assuming that the potential of the input terminal IN1 of the logic circuit L1 is low and the potential of the input terminal IN2 of the logic circuit L1 is high, the output npn transistor Q2' of the pre-stage logic circuit L2 is turned on and the output npn transistor Q2'' of another pre-stage logic circuit L3 is turned off. Therefore, the potential of the input terminal IN1 is nearly equal to 0.3 V, which is the collector-emitter voltage of the pre-stage npn transistor Q2', and the input npn transistor Q1 of the logic circuit L1 is turned on. Since the input npn transistor Q1 is not a transistor having a Schottky barrier diode, the transistor Q1 is completely saturated and the collector-emitter voltage is approximately 0.1 V. In this condition, a current flow from the voltage source $V_{CC}$ through the resistor R2, the transistor Q1 of the logic circuit L1, and the transistor Q2' of the pre-stage logic circuit L2 to ground, so that the potential of the base of the pnp transistor Q3 is low and the pnp transistor Q3 is turned on. Therefore, no current is supplied to the base of the output npn transistor Q2 and the transistor Q2 is turned off. Since the pnp transistor Q3 is turned on and a current flows from the voltage source $V_{CC}$ through the third resistor R3 and the transistor Q3, the potential of the output terminal OUT is in a logical high level but is much lower than the potential of the voltage source $V_{CC}$. In this case, the high level potential $V_{OH}$ of the output terminal OUT is equal to the sum of the base-emitter voltage $V_{BE}$ (Q3)=0.7 V of the pnp transistor Q3, the collector-emitter voltage $V_{CE}$ (Q1)=0.1 V of the input npn transistor Q1, and the collector-emitter voltage $V_{CE}$ (Q2')=0.3 V of the pre-stage output npn transistor Q2'. Therefore, the potential $V_{OH}=V_{BE}(Q3)+V_{CE}(Q1)+V_{CE}(Q2')$ is equal to 1.1 V. In a practical circuit of an LSI, the output terminal of the pre-stage logic circuit L2, i.e., the collector of the output npn transistor Q2', is connected to another logic circuit (not shown in FIG. 5), the collector-emitter voltage $V_{CE}$ (Q2') rises to approximately 0.35 V, and the potential $V_{OH}$ of the output terminal OUT of the logic circuit is larger than or equal to 1.1 V.

Figure 6:
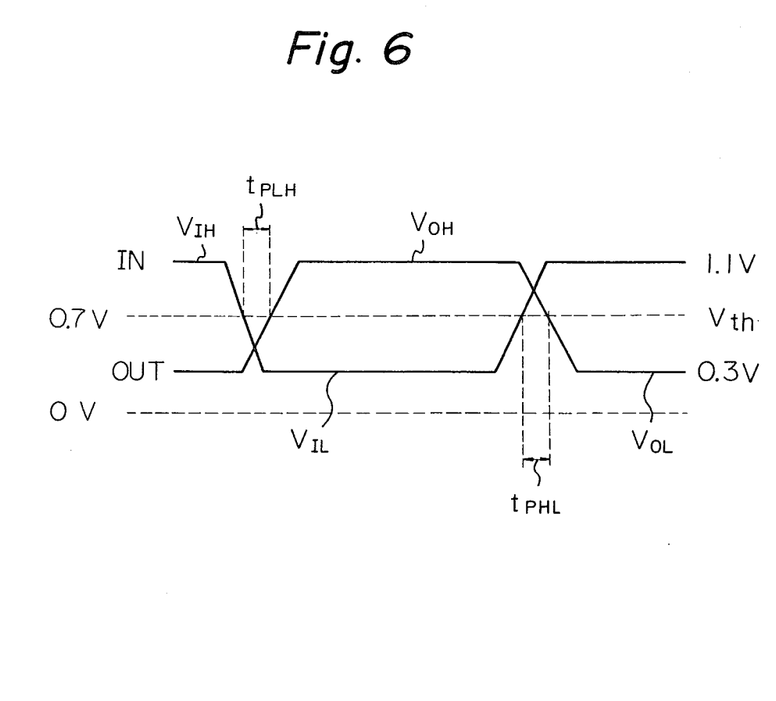
FIG. 6 is waveform diagram for the operation of the circuit of FIG. 4.

When the pre-stage output npn transistor Q2' is turned off and the potential of the input terminal IN1 of the logic circuit L1 is high, the input npn transistor Q1 is turned off, the pnp transistor Q3 is turned off, and the output npn transistor Q2 is turned on, so that the low level potential $V_{OL}$ of the output terminal OUT is virtually equal to 0.3 V. Therefore, the pnp transistor Q3 operates in a complementary manner in relation to the output npn transistor Q2, and, as illustrated in FIG. 6, the logical signal amplitude $V_{OH}-V_{OL}$ at the output terminal OUT becomes a small value which is virtually equal to 0.3 V. Since the potential $V_{OH}$ of the high level signal at the output terminal OUT is virtually equal to 1.1 V, the value is higher than that of the fundamental logic circuit of FIG. 3, the noise immunity of the fundamental logic circuit according to the present invention is much greater than that of the conventional logic circuit of FIG. 3. As illustrated in FIG. 6, the threshold potential $V_{th}$ of the input signal to the logic circuit according to the present invention is nearly equal to 0.7 V, which is the central value between the high level voltage $V_{IH}$ or $V_{OH}$ (1.1 V) and the low level voltage $V_{IL}$ or $V_{OL}$ (0.3 V). Therefore, uniform noise immunity is realized with regard to the high level logic signal and the low level logic signal.

It should also be noted that since the signal amplitude $V_{OH}-V_{OL}$ is smaller than that of the conventional logic circuit of FIG. 1, the propagation delays $t_{PLH}$ and $t_{PHL}$ of the fundamental logic circuit according to the present invention can be very small.

Figure 7:
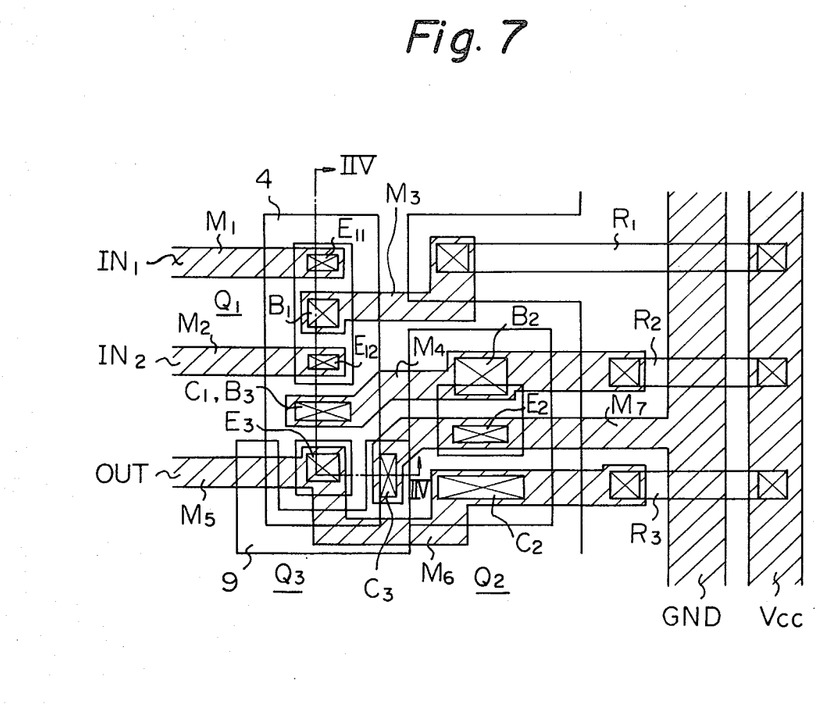
FIG. 7 is a plan view of the circuit pattern of the circuit of FIG. 4 formed in an integrated circuit.

FIG. 7 is a plan view of a circuit pattern of the fundamental logic circuit of FIG. 4 formed in an integrated circuit device. In FIG. 7, the hatched portions are metal conductor layers. An input terminal IN1 is connected to the first emitter electrode E11 of an input transistor Q1 through a metal conducting layer M1. Another input terminal IN2 is connected to the second emitter electrode E12 of the transistor Q1 through a metal conducting layer M2. The base electrode B1 of the transistor Q1 is connected to a terminal of the first resistor region R1 through the metal conductor layer M3, and another terminal of the first resistor region R1 is connected to a power supply line $V_{CC}$. The collector electrode C1 of the transistor Q1 is commonly formed with the base electrode B3 of a pnp transistor Q3 and is connected to the base electrode B2 of an output transistor Q2 and to a terminal of the second resistor region R2 through a metal conducting layer M4. Another terminal of the resistor region R2 is connected to the power supply line $V_{CC}$, and an output terminal OUT is connected to the emitter electrode E3 of the pnp transistor Q3 through a metal conducting layer M5. The emitter electrode E3 of the pnp transistor Q3 is connected to the collector electrode C2 of the output transistor Q2 and to a terminal of the third resistor region R3 through a metal conducting layer M6. Another terminal of the third resistor region R3 is connected to the power supply line $V_{CC}$. The collector electrode C3 of the pnp transistor Q3 and the emitter electrode E2 of the output transistor Q2 are connected to a ground line GND through a metal conducting layer M7.

Figure 8:
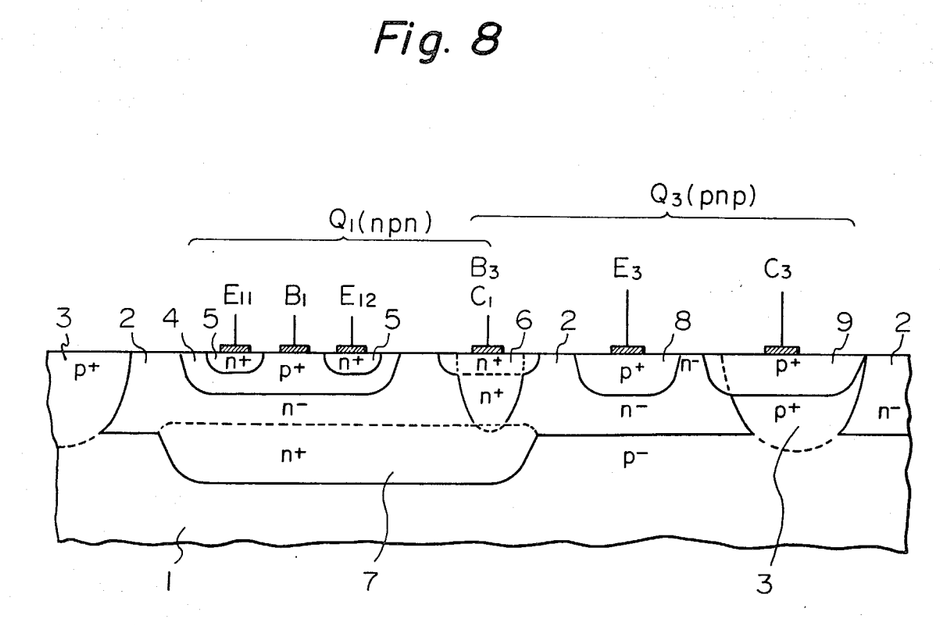
FIG. 8 is a cross-sectional view taken along the line IIV—IIV of FIG. 7.

FIG. 8 is a cross-sectional view of the device of FIG. 7 taken along the line IIV—IIV of FIG. 7. In FIG. 8, 1 designates a $p^-$-type semiconductor substrate and 2 designates $n^-$-type epitaxial layers which are formed on the substrate 1 and which are separated from each other by $p^+$-type isolation regions 3. A $p^+$-type base region 4 of an input transistor Q1 is formed in the $n^-$-type epitaxial layer 2 and $n^+$-type emitter regions 5 are formed in the $p^+$-type base region 4. An $n^+$-type region 6 which operates as the collector C1 of the transistor Q1 and a base B3 of a pnp transistor Q3 are formed in the $n^-$-type epitaxial region 2. In order to decrease the series resistance between the collector and the emitters of the transistor Q1, an $n^+$-type buried layer 7 is formed between the substrate 1 and the epitaxial layer 2. A $p^+$-type region 8 formed in the epitaxial layer 2 constitutes the emitter E3 of the pnp transistor Q3, and another $p^+$-type region 9 formed in the $p^+$-type isolation region 3 constitutes the collector C3 of the pnp transistor Q3. Therefore, the pnp transistor Q3 is constituted of a combination of a lateral pnp structure formed by the $p^+$-type emitter region 8, the $n^-$-type epitaxial layer 2, and the $p^+$-type collector region 9, and a vertical pnp structure formed by the $p^+$-type emitter region 8, the $n^-$-type epitaxial layer 2, and the $p^-$-type substrate 1. Moreover, the $p^+$-type collector region 9 has a C-shape and is formed to surround the $p^+$-type emitter region 8. Even when the thickness of the $n^-$-type epitaxial layer 2 existing between the $p^+$-type emitter region 8 and the substrate 1 is not small enough, the pnp transistor Q3 can operate normally.

As is apparent from the above explanation with reference to FIGS. 7 and 8, the additional pnp transistor Q3 comprises the base region B3, the collector region C3, and the emitter region E3. However, the base region B3 is common to the collector region C1 of the input transistor Q1 and the collector region C3 is common to the p-type substrate 1 and the isolation region 3 on the substrate 1. Therefore, the additional region necessary for the pnp transistor Q3 can be very small.

According to the present invention, in an inverter-type fundamental logic circuit comprising an input npn transistor and an output npn transistor, a pnp-type transistor is additionally connected in parallel to the output npn transistor. By using such a construction, it is possible to decrease the logical signal amplitude of the fundamental logic circuit to approximatey 0.3 V and to reduce the propagation delay so as to obtain a high-speed operation without deteriorating the noise immunity and without decreasing the degree of integration.

Having described a specific embodiment of the present invention, it is believed to be obvious that various modifications and variations are possible in the light of the above teachings. The input npn transistor Q1 having two emitters can be replaced by an npn transistor having any number of emitters.

I claim:

1. A TTL fundamental logic circuit, having a load circuit operatively connected to a power supply and having input and output terminals, comprising:
    an npn-type input transistor having an emitter operatively connected to the input terminal, having a base operatively connected to a power supply, and having a collector;
    a Schottky npn-type output transistor having an emitter operatively connected to ground, having a collector operatively connected to the load circuit and the output terminal, and having a base operatively connected to said collector of said npn-type input transistor; and
    a pnp-type output transistor having an emitter operatively connected to said collector of said Schottky npn-type output transistor, having a base operatively connected to said base of said Schottky npn-type output transistor, and having a collector operatively connected to ground.

2. A TTL fundamental logic circuit according to claim 1, wherein said npn-type input transistor is a multi-emitter-type transistor.

3. A TTL fundamental logic circuit according to claim 1, further comprising an isolation region, wherein said npn-type input transistor and said pnp-type output transistor are formed in a region surrounded by said isolation region, and said collector of said npn-type input transistor and said base of said pnp-type output transistor are integrally formed.

4. A TTL fundamental logic circuit according to claim 3, wherein said collector of said pnp-type output transistor is formed in said isolation region.

5. A TTL fundamental logic circuit according to claim 3 or 4, wherein said collector of said pnp-type output transistor is formed surrounding said emitter of said pnp-type output transistor.

* * * * *

UNITED STATES PATENT AND TRADEMARK OFFICE
CERTIFICATE OF CORRECTION

PATENT NO. : 4,471,239
DATED : SEPTEMBER 11, 1984
INVENTOR(S) : OSAM OHBA

It is certified that error appears in the above-identified patent and that said Letters Patent is hereby corrected as shown below:

Col. 2, line 39, "R2" should be --R3--.

Col. 3, line 3, "$V_{BE}$" should be --$V_{BC}$--.

Col. 4, line 24, "flow" should be --flows--.

Col. 5, line 19, "elc-" should be --elec- --.

Col. 6, line 22, "approximatey" should be --approximately--.

Signed and Sealed this

Twenty-sixth Day of March 1985

[SEAL]

Attest:

DONALD J. QUIGG

*Attesting Officer*   *Acting Commissioner of Patents and Trademarks*